United States Patent [19]

Nakano et al.

[11] Patent Number: 4,545,037
[45] Date of Patent: Oct. 1, 1985

[54] DYNAMIC SEMICONDUCTOR MEMORY DEVICE WITH BALANCED SENSING ARRANGEMENT

[75] Inventors: Tomio Nakano; Masao Nakano, both of Kawasaki; Junji Ogawa, Yokohama, all of Japan

[73] Assignee: Fujitsu Limited, Kawasaki, Japan

[21] Appl. No.: 508,504

[22] Filed: Jun. 28, 1983

[30] Foreign Application Priority Data

Jun. 28, 1982 [JP] Japan ................. 57-111187

[51] Int. Cl.[4] ........................... G11C 5/06
[52] U.S. Cl. ................... 365/205; 365/207; 365/208; 365/149; 307/530
[58] Field of Search ........... 365/205, 206, 207, 208, 365/149, 226; 307/530, 200 B; 357/23 C

[56] References Cited

U.S. PATENT DOCUMENTS

| 4,255,679 | 3/1981 | White, Jr. et al. | 365/205 |
| 4,259,729 | 3/1981 | Tokushige | 365/226 |
| 4,286,178 | 8/1981 | Rao et al. | 365/205 |
| 4,419,743 | 12/1983 | Taguchi et al. | 365/149 |

Primary Examiner—Stuart N. Hecker
Assistant Examiner—Glenn A. Gossage
Attorney, Agent, or Firm—Staas & Halsey

[57] ABSTRACT

A dynamic semiconductor memory device of an open bit-line type includes a plurality of first wiring lines running on common opposite electrodes for forming opposite electrodes of memory cell capacitors and connected to the common opposite electrodes at a number of contact points. A second wiring line is connected to the ends of the first wiring lines and to a voltage supply line at the center point of the second wiring line, so that the potential distribution of the common opposite electrodes can be equalized precisely.

5 Claims, 6 Drawing Figures

DYNAMIC SEMICONDUCTOR MEMORY DEVICE WITH BALANCED SENSING ARRANGEMENT

BACKGROUND OF THE INVENTION

1. Field of the Invention

The present invention relates to a dynamic semiconductor memory device, more particularly, to a dynamic semiconductor memory device wherein the potential distribution of a common opposite electrode forming one electrode of an information storing capacitor of each memory cell is equalized so that highly sensitive sense amplifiers in the memory device will not operate erroneously due to a potential difference in the common electrode.

2. Description of the Prior Art

Generally, dynamic semiconductor memory devices may be classified into two types according to how their bit lines are fed out from the sense amplifier, i.e., a folded bit-line type and an open bit-line type.

In the folded bit-line type dynamic semiconductor memory device, a pair of bit lines BL and $\overline{BL}$ led out from a sense amplifier are arranged to run in parallel from one side of the sense amplifier circuit. The opposite electrodes of the memory cell capacitors are formed from a single conductive plate.

In the open bit-line type dynamic semiconductor memory device, a pair of bit lines BL and $\overline{BL}$ led out from a sense amplifier, are arranged to run in opposite directions from the sides of the sense amplifier. The opposite electrodes of the memory cell capacitors are formed from two common conductive plates arranged at both sides of the sense amplifier. Since the two opposite electrodes straddle the area in which the sense amplifiers are formed, however, the sense amplifiers are apt to be influenced by noise due to an imbalance between the potentials of the two opposite electrodes. The sense amplifiers are so high in sensitivity that they can detect minute potential differences between the pair of bit lines determined by the information data stored in the memory cell.

To eliminate the above-mentioned problem, there has previously been proposed an open bit-line type dynamic semiconductor memory device wherein a plurality of points of the separated opposite electrodes are connected to voltage supply lines $V_{CC}$ or $V_{SS}$ running in peripheral circuits through metallic wiring lines.

Now, in a dynamic semiconductor memory device, the memory cell capacitor may be formed in two ways. In one, the common opposite electrode is connected to a higher voltage supply $V_{CC}$, usually +5 V, so as to form an inversion layer in a vertical type semiconductor layer under the common opposite electrode. Accordingly, a memory cell capacitor is formed by the common electrode, the inversion layer, and an insulator layer formed on the surface of the semiconductor substrate between the common electrode and the inversion layer. In a dynamic semiconductor memory device formed in this way, the plurality of points of the common opposite electrodes are connected to the higher voltage supply $V_{CC}$ so to equalize the potential distribution on the common opposite electrodes.

In the other way, a depletion type metal oxide semiconductor (MOS) capacitor is formed by implanting impurities on the surface of the semiconductor substrate, so that it is not necessary to apply a positive potential to the opposite electrode for the inversion layer formation. The common opposite electrode is connected to a lower voltage supply $V_{SS}$, usually 0 V. In a dynamic semiconductor memory device formed in this way, the plurality of points of the common opposite electrodes are connected to the lower voltage supply $V_{SS}$ so as to equalize the potential distribution on the common opposite electrodes.

However, in the above-mentioned dynamic semiconductor memory device, since circuits for generating various clock signals are provided in the peripheral circuits PC, the potentials of the voltage supply lines vary locally when these clock generator circuits operate. Since the common opposite electrodes have wide areas and are formed by relatively low conductive material such as polycrystalline silicon, the above-mentioned potential variance of the voltage supply lines is not immediately transmitted all over the common opposite electrodes. Thus, a potential difference may be produced between the opposite electrode of a selected memory cell capacitor and the opposite electrode of a corresponding dummy cell. This may cause the sense amplifiers to operate erroneously.

SUMMARY OF THE INVENTION

The object of the present invention is to provide a dynamic semiconductor memory device of the open bit-line type, wherein the potential distribution on the divided two common opposite electrodes for memory cell capacitors can be equalized with more precision and, accordingly, the sense amplifiers can be prevented from operating erroneously due to a potential difference between the two common opposite electrodes.

In accordance with the present invention, there is provided a dynamic semiconductor memory device, comprising a plurality of sense amplifiers arranged in a row; pairs of bit lines, each pair of bit lines connected to one of the sense amplifiers and extending from the sides of the sense amplifier in directions opposite to each other; a plurality of word lines arranged in parallel, each word line extending in a direction vertical to the bit lines; a plurality of memory cells arranged at cross points of the bit lines and the word lines, each memory cell having at least a transistor and a capacitor for storing information data; two common electrodes for forming opposite electrodes of the capacitors of memory cells, one of the two common electrodes arranged in one side of the row of the sense amplifiers, and another arranged in another side of the row of the sense amplifiers; a plurality of first wiring lines, each of the first wiring lines extending on the common electrodes in a direction vertical to the bit lines and connected to the common electrode at a plurality of points; and a second wiring line for connecting commonly the plurality of first wiring lines at one end of each first wiring line, the second wiring line connected to a voltage supply line at an approximate center point of the second wiring line.

In addition, in order to equalize the potential distribution of the two common opposite electrodes with more precision, a loop may be formed by the group of first wiring lines and two second wiring lines.

DESCRIPTION OF THE PREFERRED EMBODIMENT

Before describing a preferred embodiment of the present invention, the foregoing prior art dynamic semiconductor memory device is described in detail with reference to the drawings.

Figure 1:
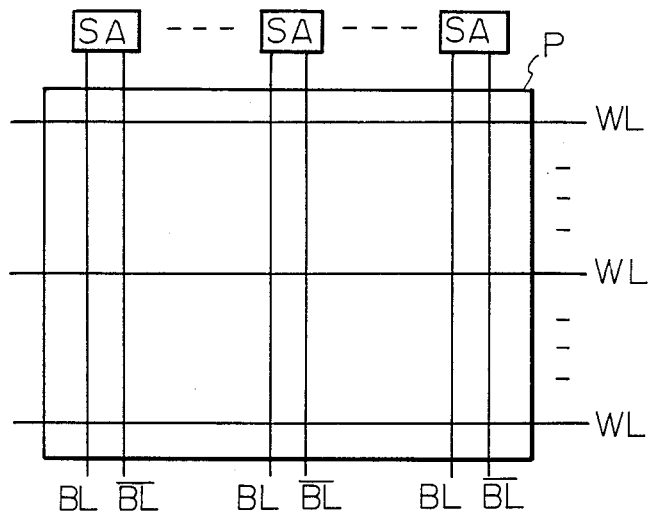
FIG. 1 is a block diagram of a prior art dynamic semiconductor memory device of a folded bit-line type.

FIG. 1 is a block diagram of a dynamic semiconductor memory device of the folded bit-line type for comparison with the open bit-line type. The dynamic semiconductor memory device comprises sense amplifiers SA, pairs of bit lines BL and $\overline{BL}$, word lines WL, memory cells (not shown), and a common opposite electrode P. In a memory device of the folded bit-line type, each pair of bit lines BL and $\overline{BL}$ extends from one sense amplifier SA in parallel to the same direction.

Figure 2:
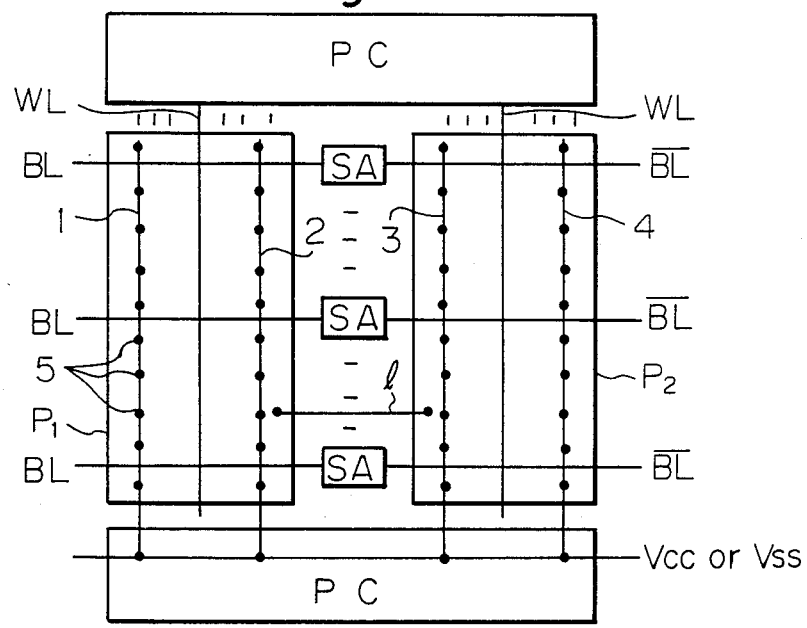
FIG. 2 is a block diagram of a prior art dynamic semiconductor memory device of an open bit-line type.

FIG. 2 is a block diagram of a prior art dynamic semiconductor memory device of the open bit-line type. In the dynamic semiconductor memory device of FIG. 2, a plurality of sense amplifiers SA are arranged in a row in the center of the device. A pair of bit lines BL and $\overline{BL}$ extend from each sense amplifier SA to the left direction (BL) and to the right direction ($\overline{BL}$), respectively. Word lines WL are arranged in parallel and extend in a direction vertical to the bit line BL or $\overline{BL}$. A plurality of memory cells (not shown) are arranged at the cross points of the bit lines BL or $\overline{BL}$ and the word lines WL. Each memory cell has a transistor and a capacitor. Two common opposite electrodes $P_1$ and $P_2$ are arranged at the sides of the row of the sense amplifiers SA to form an opposite electrode of each memory cell capacitor. Various peripheral circuits PC are provided around the area for the memory cells and the sense amplifiers SA in the memory device.

In the memory device of FIG. 2, in order to equalize the potential distribution on the common opposite electrodes $P_1$ and $P_2$, aluminum (Al) wiring lines 1 through 4 are arranged so as to run on the common opposite electrodes $P_1$ and $P_2$ at their side portions and are connected to the common opposite electrodes $P_1$ and $P_2$ at a number of contact points 5. The ends of the Al wiring lines 1 through 4 are connected to a voltage supply line $V_{CC}$ or $V_{SS}$ running in the peripheral circuit PC.

Figure 3:
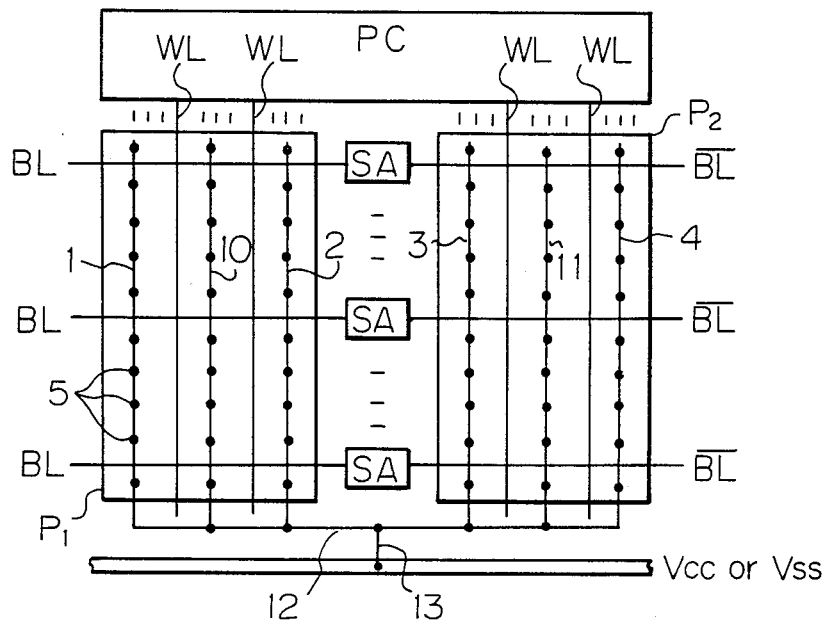
FIG. 3 is a block diagram of a dynamic semiconductor memory device in accordance with an embodiment of the present invention.

In the above-mentioned memory device, the local potential variance on the voltage supply line $V_{CC}$ or $V_{SS}$ due to the circuit operation, etc., may be transmitted to the common opposite electrodes $P_1$ and $P_2$ through the Al wiring lines 1 to 4 which are connected to the various points of the voltage supply line $V_{CC}$ or $V_{SS}$. This means that a potential difference between the two common opposite electrodes $P_1$ and $P_2$ may be produced by the local potential variance on the voltage supply line $V_{CC}$ or $V_{SS}$. It may be thought to connect the two common electrodes $P_1$ and $P_2$ through a wiring line l as shown in FIG. 3 in order to equalize the potentials of the common electrodes $P_1$ and $P_2$. However, since a large number of sense amplifiers SA are arranged in a row between the two common opposite electrodes $P_1$ and $P_2$, it is difficult to obtain the necessary space for this wiring line l. Furthermore, though this wiring line l should be formed from aluminum, the fact that the word lines WL running vertically to the wiring line l are usually formed from aluminum makes this difficult.

A dynamic semiconductor memory device in accordance with an embodiment of the present invention is illustrated in FIG. 3. The dynamic semiconductor memory device of FIG. 3 has the same construction as that of FIG. 2, except that Al wiring lines 1 through 4, 10, and 11, running on the common opposite electrodes $P_1$ and $P_2$ in the direction of the word lines WL and being connected to the common opposite electrodes $P_1$ and $P_2$ at a large number of contact points 5, are connected commonly to an Al wiring line 12 at their ends. The Al wiring line 12 is connected to the voltage supply line $V_{CC}$ or $V_{SS}$ through an Al wiring line 13 at only the center point of the Al wiring line 12.

In the dynamic semiconductor memory device of FIG. 3, even though local potential variance may exist on the voltage supply line $V_{CC}$ or $V_{SS}$, the potential variance at one point on the voltage supply line $V_{CC}$ or $V_{SS}$ is led out through the Al wiring line 3 to the Al wiring line 12 and is then transmitted to the common opposite electrodes $P_1$ and $P_2$ through the Al wiring lines 1 through 4, 10, and 11. Thus, even considering the transmission time of the potential variance, the potentials of the pairs of Al wiring lines (2 and 3), (10 and 11), or (1 and 4) positioned symmetrically with respect to the row of sense amplifiers SA are kept equal, and the corresponding portions of the common opposite electrodes $P_1$ and $P_2$ have the same potential.

Since the sense amplifiers SA operate in accordance with the potential difference between the pairs of bit lines BL and $\overline{BL}$, (the bit lines BL running on the common opposite electrode $P_1$ and the bit lines $\overline{BL}$ running on the common opposite electrode $P_2$), the sense amplifiers SA are not influenced by the symmetrical potential variance of the common opposite electrodes $P_1$ and $P_2$, even if the potential distribution on the common electrodes $P_1$ and $P_2$ varies with time and space. Thus, in the dynamic semiconductor memory device of FIG. 3, the operation error of the sense amplifiers SA due to the potential difference between two common electrodes $P_1$ and $P_2$ can be prevented more readily than in prior art devices.

In the above-mentioned embodiment, six Al wiring lines 1 through 4, 10, and 11 are arranged on the common electrodes $P_1$ and $P_2$. Of course, in order to equalize the potential distribution of the common electrodes $P_1$ and $P_2$ more precisely, the number of such Al wiring lines should be increased as much as possible. However, increasing the number of such Al wiring lines means decreasing the area for forming a memory cell and complicates the wiring layout. Thus, this number cannot be increased too much.

Figure 4:
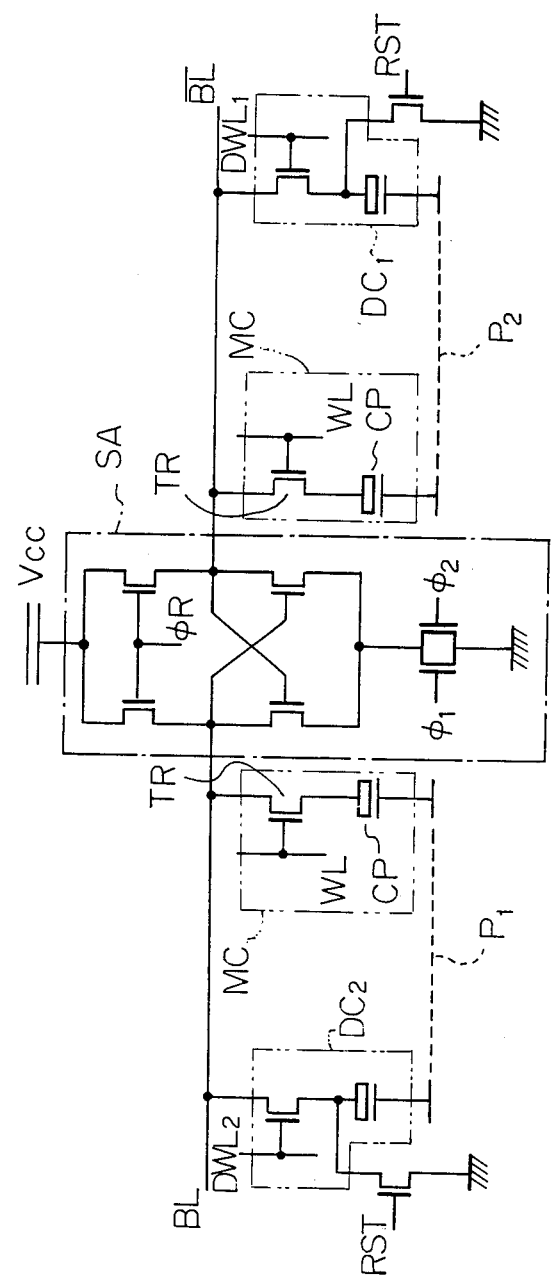
FIG. 4 is a circuit diagram of the main portions of the memory device of FIG. 3.

A circuit diagram of the main portions of the memory device of FIG. 3 is set forth in FIG. 4. As shown in FIG. 4, a plurality of memory cells MC and a dummy memory cell $DC_2$ are connected to one bit line BL, and a plurality of memory cells MC and a dummy memory cell $DC_1$ are connected to another bit line $\overline{BL}$. Each memory cell MC has a transfer gate transistor TR and an information storage capacitor CP. The opposite electrodes of the capacitors CP of the memory cells MC connected to the bit line BL are formed from the common electrode $P_1$, and the opposite electrodes of the capacitors CP of the memory cells MC connected to the bit line $\overline{BL}$ are formed from the common electrode $P_2$. The capacitor CP may be formed as a depletion type.

Figure 6:
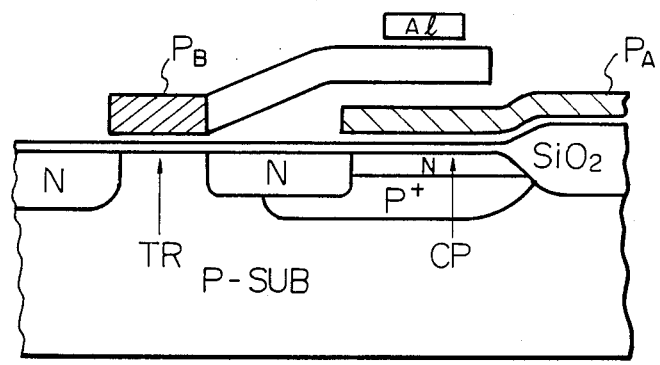
FIG. 6 is a cross-sectional view of the memory device of FIG. 3.
Figure 5:
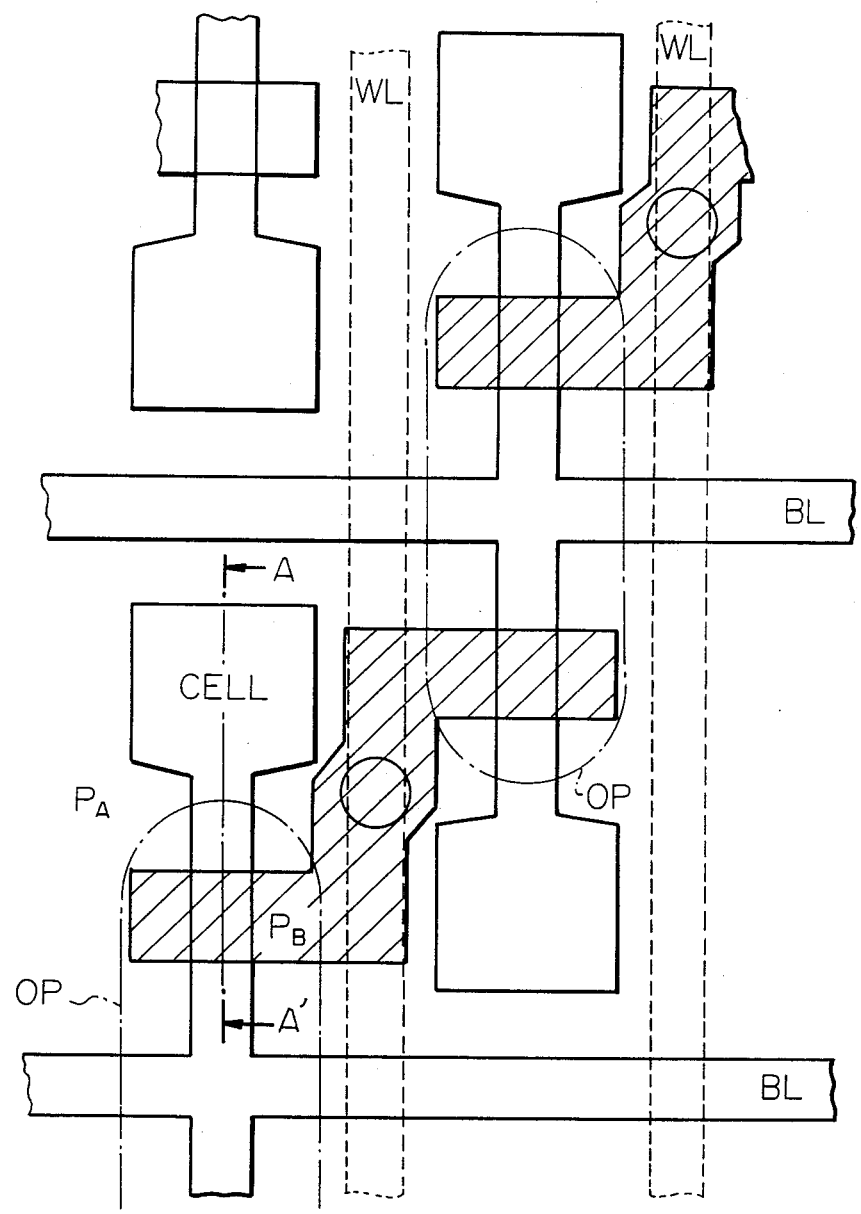
FIG. 5 is a plan view of a surface pattern of the memory device of FIG. 3.

One examples of a wiring layout of the dynamic semiconductor memory device of FIG. 3 is illustrated by the plan view of FIG. 5. Its cross-sectional view is illustrated in FIG. 6. The memory device of FIG. 3 may be formed on a P-type semiconductor substrate. Bit lines BL and $\overline{BL}$ are formed from N-type diffusion layers. Word lines WL are formed from Al wiring lines. The common opposite electrode $P_1$ or $P_2$ is formed from a polycrystalline silicon layer $P_A$ which has opening portions OP. The gate electrodes of the transistors TR are formed from polycrystalline silicon layers $P_B$.

We claim:

1. A dynamic semiconductor memory device connected to a voltage supply line, comprising:
    a plurality of sense amplifiers arranged in a row;
    pairs of bit lines, respectively connected to said sense amplifiers, each of the bit lines in said pairs of bit lines extending from one of the sides of the corresponding one of said sense amplifiers in directions opposite to each other;
    a plurality of word lines arranged substantially in parallel and intersecting said bit lines, each of said word lines extending in a direction substantially perpendicular to said bit lines;
    a plurality of memory cells arranged at the intersections of said bit lines and said word lines, each memory cell having at least a transistor and a capacitor connected to said transistor, for storing information data;
    a first common electrode, positioned on one side of the row of said sense amplifiers, for commonly connecting electrodes of said capacitors of said memory cells located on said one side of the row of said sense amplifiers;
    a second common electrode, positioned on the other side of the row of said sense amplifiers, for commonly connecting electrodes of said capacitors of said memory cells located on the other side of the row of said sense amplifiers;
    a plurality of first wiring lines, each of said first wiring lines extending on said first and second common electrodes in the direction substantially perpendicular to said bit lines and connected to said first and second common electrodes at a plurality of points; and
    a second wiring line for connecting commonly said plurality of first wiring lines at one end of each first wiring line, said second wiring line connected to the voltage supply line at an approximate center point of said second wiring line.

2. A dynamic semiconductor memory device as defined in claim 1, wherein said first wiring lines are arranged symmetrically with respect to said row of sense amplifiers.

3. A dynamic semiconductor memory device as defined in claim 1, wherein said first wiring lines are arranged at both end portions and a center portion of said common opposite electrodes.

4. A dynamic semiconductor memory device as defined in claim 2, wherein said first wiring lines are arranged at both end portions and a center portion of said common opposite electrodes.

5. A dynamic semiconductor memory device connected to a voltage supply line, comprising:
    pairs of first and second bit lines;
    word lines extending in a direction substantially perpendicular to said pairs of first and second bit lines and intersecting said first bit lines and said second bit lines;
    sense amplifiers arranged in a row and having first and second sides, said pairs of first and second bit lines respectively connected to said sense amplifiers, said first bit lines extending from the first sides of said sense amplifiers and said second bit lines extending from the second sides of said sense amplifiers;
    memory cells arranged at the intersections of said first and second bit lines and said word lines, each memory cell comprising a transistor and a capacitor connected to said transistor;
    a first common electrode, positioned adjacent the first sides of said sense amplifiers, for commonly connecting electrodes of said capacitors of said memory cells located on said first sides of said sense amplifiers;
    a second common electrode, positioned adjacent the second sides of said sense amplifiers, for commonly connecting electrodes of said capacitors of said memory cells located on the second sides of said sense amplifiers;
    first wiring lines extending along said first common electrode in a direction substantially perpendicular to said first bit lines and connected to said first common electrode at a plurality of points;
    second wiring lines extending along said second common electrode in a direction substantially perpendicular to said second bit lines and connected to said second common electrode at a plurality of points; and
    a common wiring line commonly connected to said first wiring lines and said second wiring lines, said common wiring line connected to the voltage supply line at substantially the center of said common wiring line.

* * * * *